(12) United States Patent
Chu

(10) Patent No.: US 8,900,777 B2
(45) Date of Patent: Dec. 2, 2014

(54) APPARATUS AND METHOD FOR LITHOGRAPHY PATTERNING

(71) Applicant: Taiwan Semiconductor Manufacturing Company, Ltd, Hsin-Chu (TW)

(72) Inventor: Yuan-Chih Chu, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/658,478

(22) Filed: Oct. 23, 2012

(65) Prior Publication Data

US 2014/0113220 A1   Apr. 24, 2014

(51) Int. Cl.
*G03F 1/42*   (2012.01)

(52) U.S. Cl.
USPC .................................................. 430/5; 430/30

(58) Field of Classification Search
USPC ........................................................ 430/5, 30
See application file for complete search history.

(56) References Cited

U.S. PATENT DOCUMENTS

2012/0238096 A1*   9/2012   Xiong et al. ................... 438/694

\* cited by examiner

*Primary Examiner* — Christopher Young
(74) *Attorney, Agent, or Firm* — Haynes and Boone, LLP

(57) ABSTRACT

An apparatus and method for lithography patterning is disclosed. An exemplary method includes receiving a first mask. The method further includes receiving a defect map, the defect map identifying a defect region of a defect of the first mask. The method further includes preparing processing data, the processing data including pattern data of a semiconductor device and data associated with the defect region. The method further includes processing the first mask according to the processing data thereby forming a first portion of a pattern of the semiconductor device on the first mask, the first portion of the pattern excluding the defect region.

20 Claims, 20 Drawing Sheets

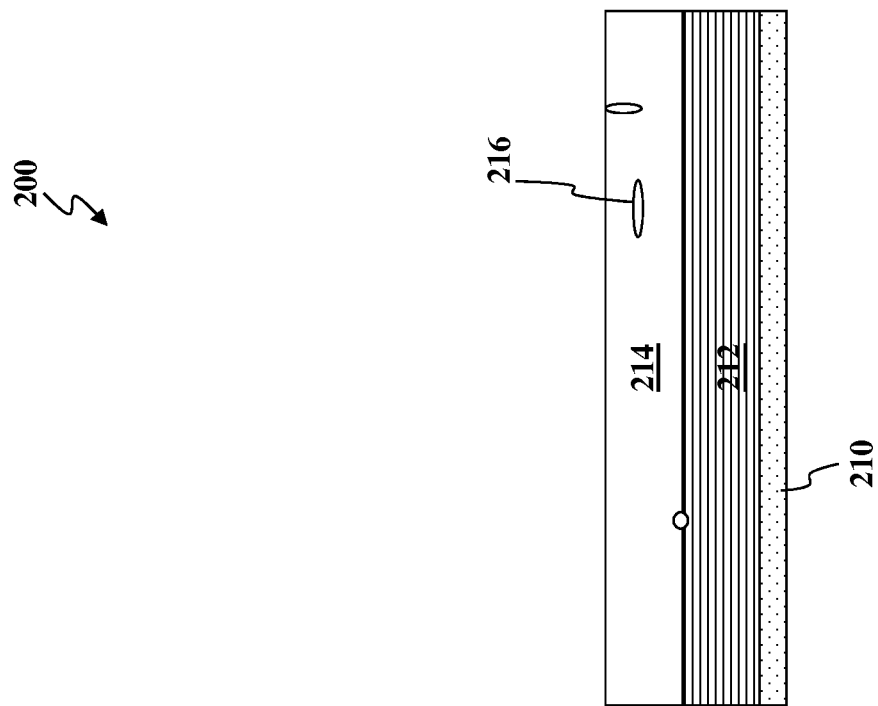
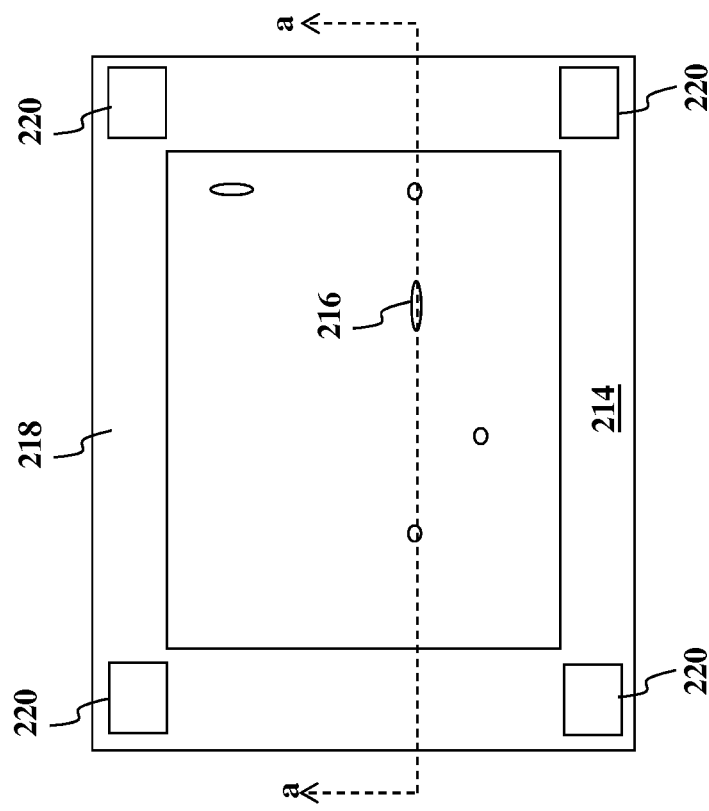
FIG. 2B
FIG. 2A

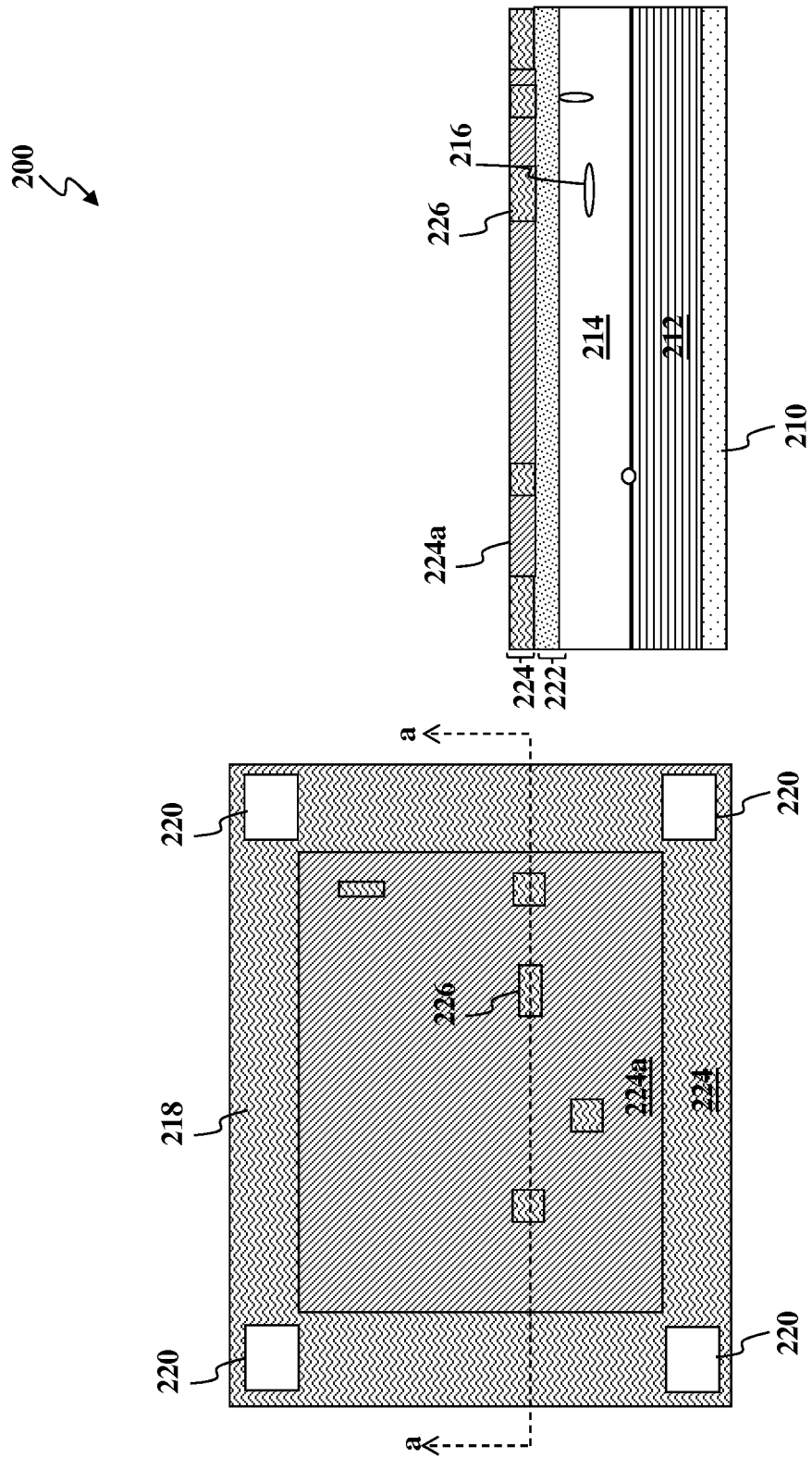

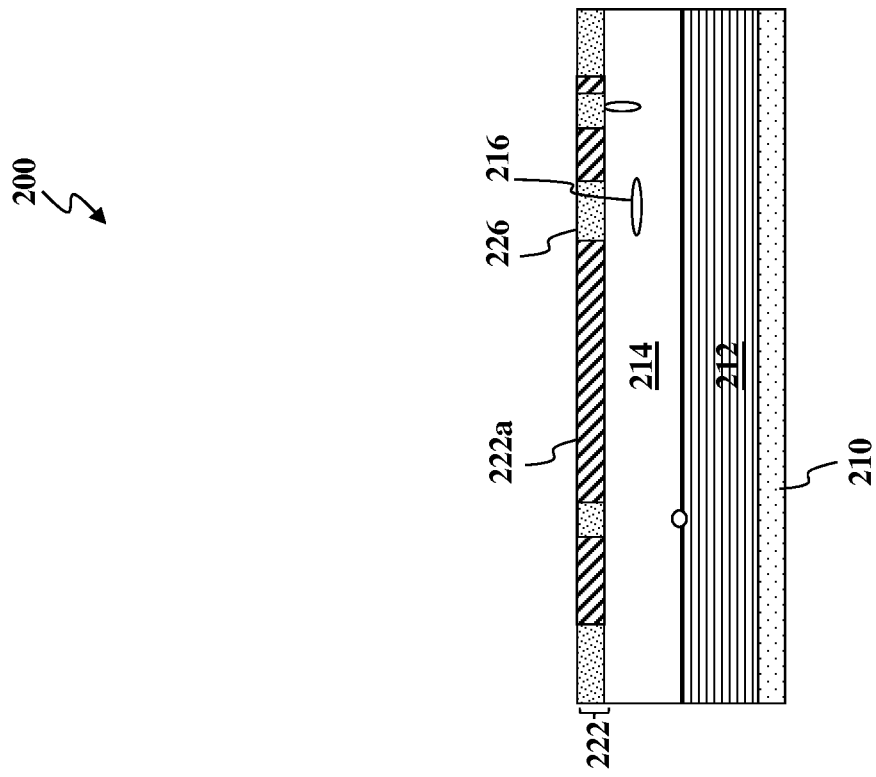
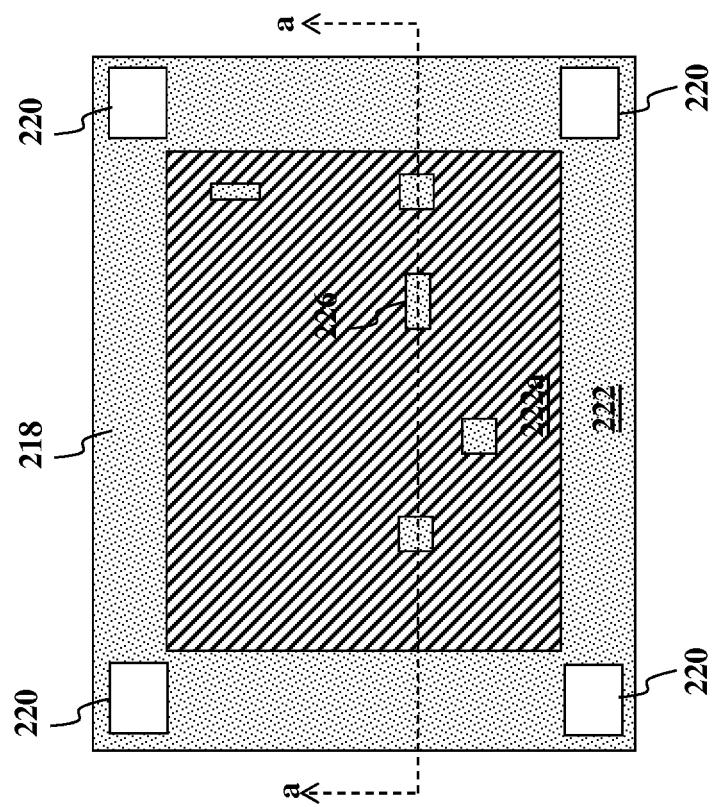
FIG. 4B
FIG. 4A

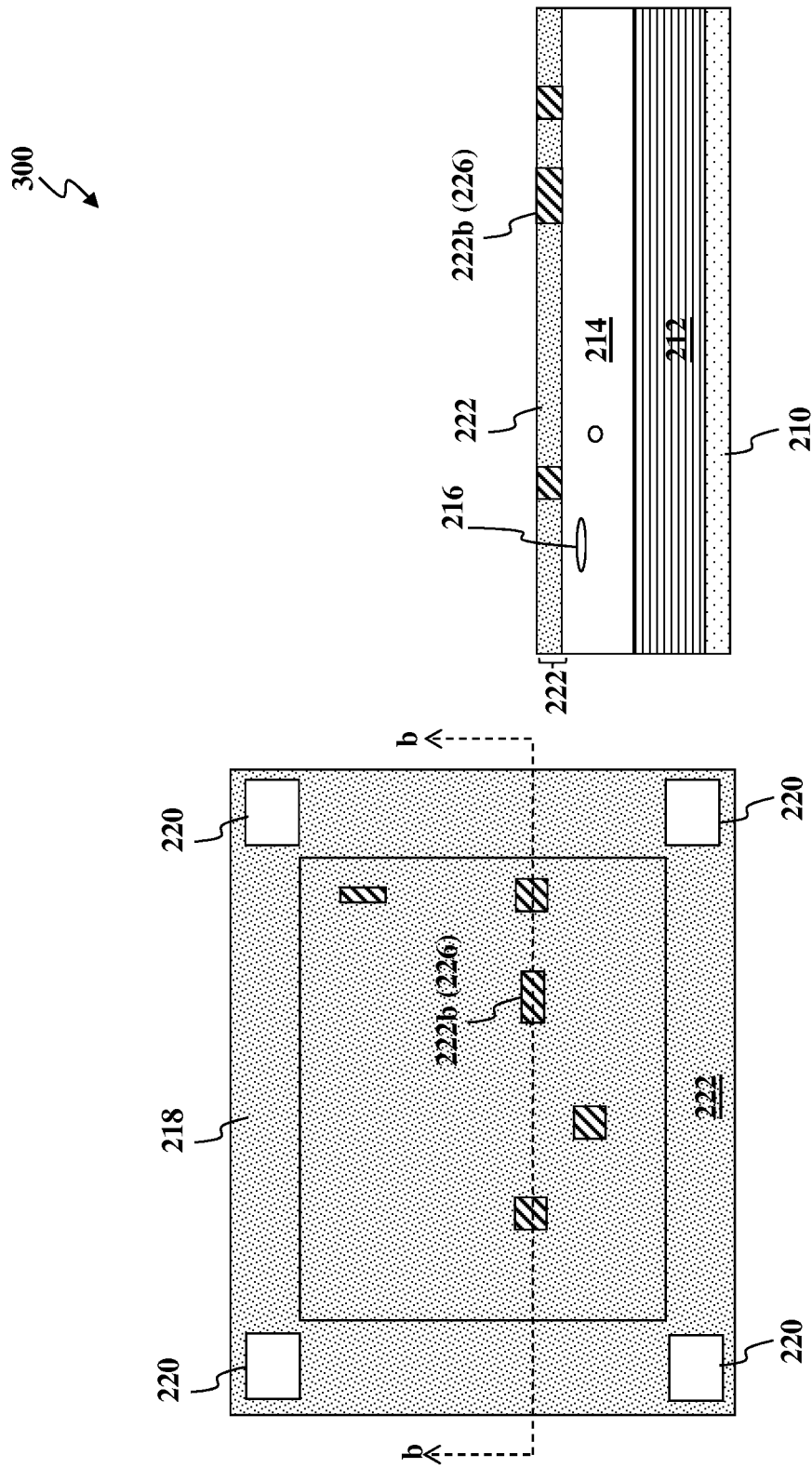

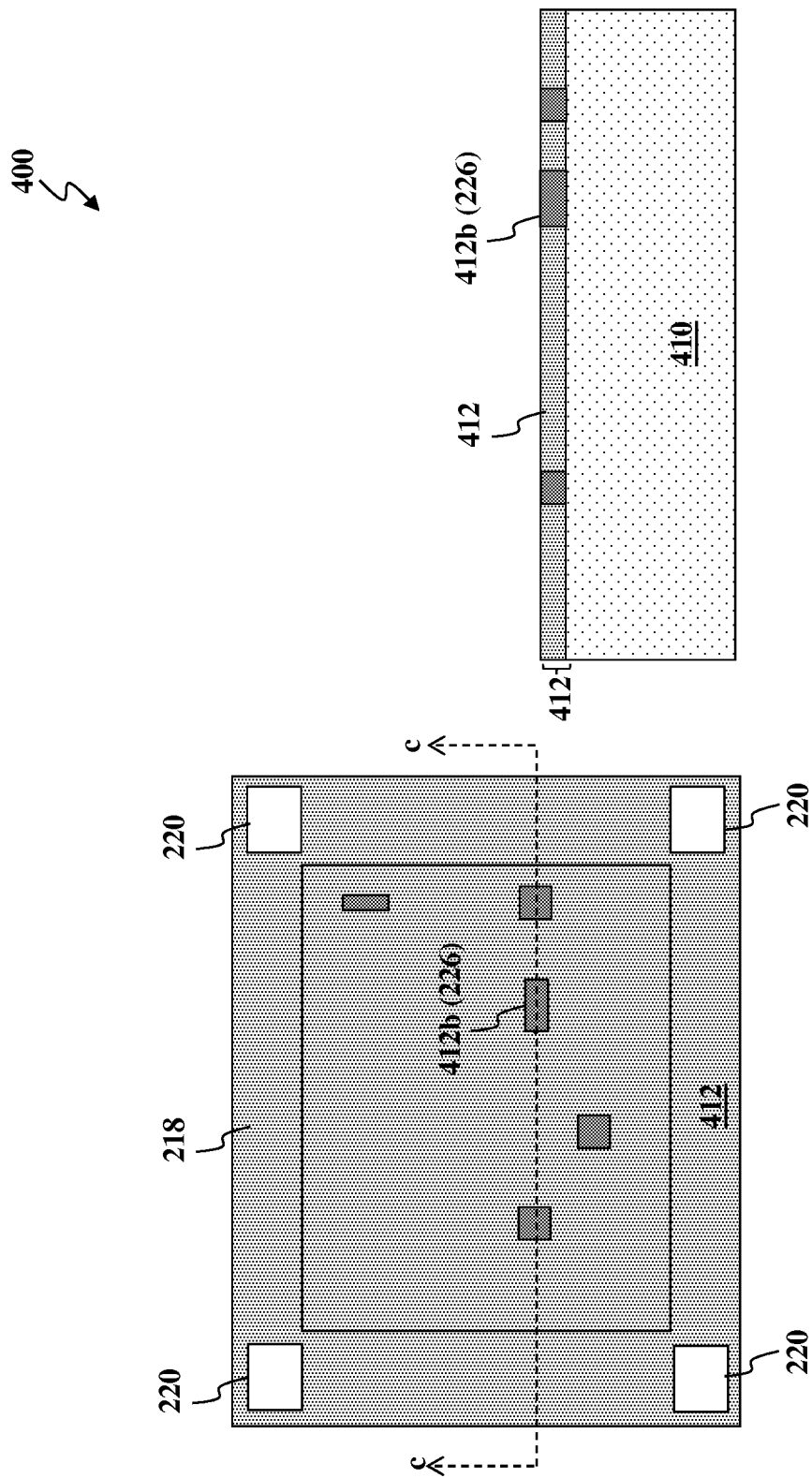

APPARATUS AND METHOD FOR LITHOGRAPHY PATTERNING

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, stricter demands have been placed on lithography process. For example, techniques such as immersion lithography, extreme ultraviolet (EUV) lithography, and e-beam lithography have been utilized to support critical dimension (CD) requirements of the smaller devices. Such lithography methods, utilize masks which frequently include various defects that introduce fabrication defects in the smaller deices. Certain compensation methods, such as repairing mask defects and requiring tighter controls for masks, may be utilized. These compensation methods, however, may significantly increase mask fabrication time and cost. Accordingly, although existing lithography methods have been generally adequate, they have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-4A illustrate top views of one embodiment of a EUV mask according to various aspects of the present disclosure.

FIGS. 2B-4B illustrate cross-sectional side views of one embodiment of a EUV mask taken along line a-a of FIGS. 2A-4A.

FIG. 5A illustrates top views of one embodiment of a EUV mask according to various aspects of the present disclosure.

FIG. 5B illustrates cross-sectional side views of one embodiment of a EUV mask taken along line b-b of FIG. 5A.

FIG. 6A illustrates top views of one embodiment of an optical mask according to various aspects of the present disclosure.

FIG. 6B illustrates cross-sectional side views of one embodiment of an optical mask taken along line c-c of FIG. 6A.

DETAILED DESCRIPTION

Figure 1:
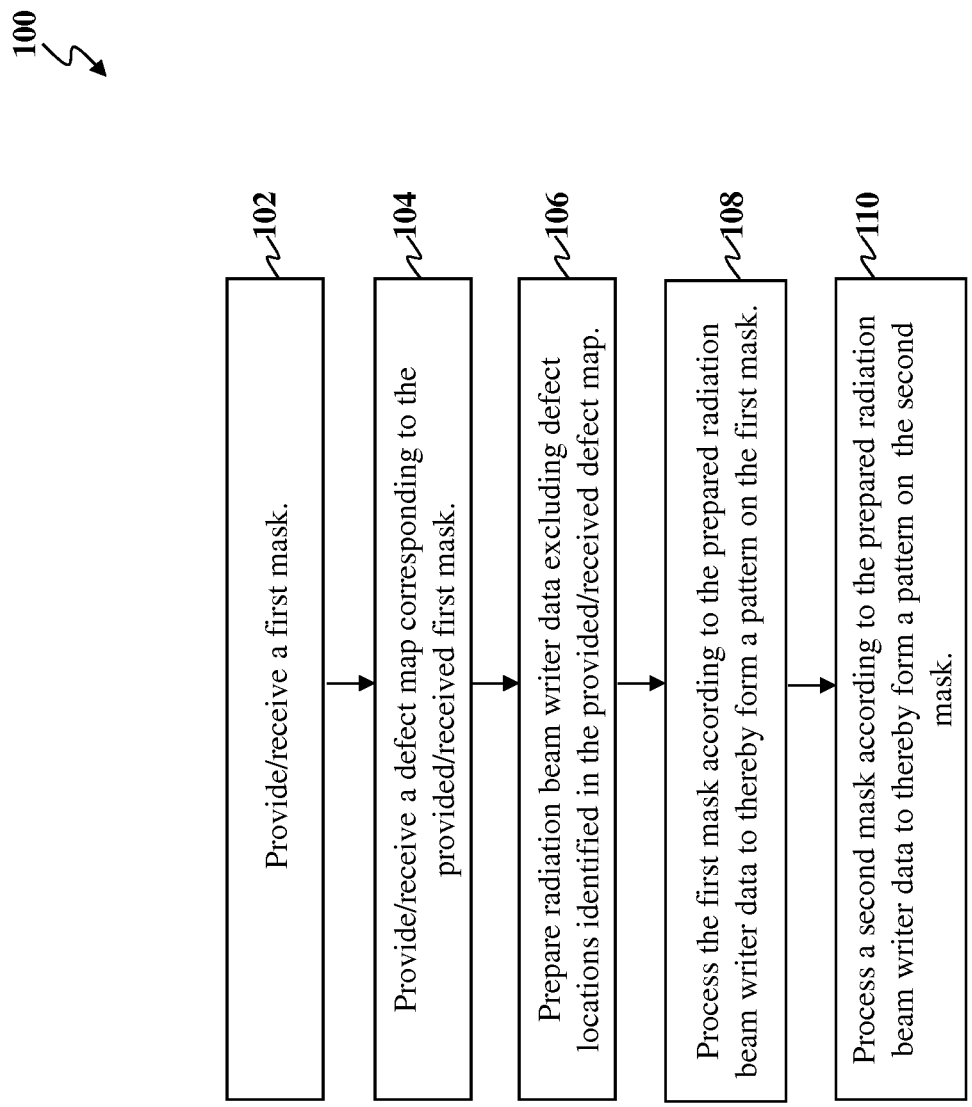
FIG. 1 is a flowchart illustrating a method of fabricating a plurality of mask according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

As semiconductor fabrication technologies continue to evolve, lithography processes have been utilized to achieve increasing functional densities and decreasing device sizes. One form of lithography is extreme ultraviolet (EUV) lithography that utilizes EUV masks. The EUV masks, however, may include various phase defects such as embedded particles or multilayer defects which adversely affect semiconductor devices that are formed using EUV mask that include such defects. To minimize these defects, various approaches have been implemented. For example, tighter tolerances may be placed on mask making processes to reduce or eliminate mask defects, with the tradeoff of higher mask cost. Further, masks defects may be repaired by various high cost processes once defects are observed. In contrast, as will be evident from the discussion that follows, the present disclosure provides for embodiments of methods and apparatus that address these concerns without the additional cost associated with the above approaches.

Examples of systems that can benefit from one or more embodiments of the present disclosure are systems that use masks in lithography patterning processes to manufacture semiconductor devices. Such processes, for example, include processes that utilize extreme ultraviolet (EUV) masks to pattern a substrate in order to manufacture semiconductor devices. Semiconductor devices may include different types of integrated circuit devices, components, and features on a single substrate. The devices may include n-type metal oxide field effect transformers (NMOS) devices, p-type metal oxide field effect transforms (PMOS) devices, input/output (I/O) NMOS, I/O PMOS, flash memory, etc. . . . The semiconductor devices may utilize an interconnect structure to perform electrical routing between the various integrated circuit devices, components, and features on the substrate and to establish electrical connections with external devices. For example, an interconnect structure may include a plurality of patterned dielectric layers and interconnected conductive layers. These interconnected conductive layers provide interconnections (e.g., wiring) between circuitries, inputs/outputs, and various doped features formed in a semiconductor substrate. In more detail, the interconnect structure may include a plurality of interconnect layers, also referred to as metal layers (e.g., M1, M2, M3, etc). Each of the interconnect layers includes a plurality of interconnect features, also referred to as metal lines. The various aspects of one or more embodiments of the present disclosure are described in more detail below.

With respect to FIGS. 1-4, a method 100 and a lithography mask 200 are collectively described below. In the present embodiment, FIG. 1 is a flow chart of a method 100 for fabricating a plurality of masks (or reticles) according to various aspects of the present disclosure. The method 100 begins at block 102 where a first mask is provided or received. In the present embodiment, the first mask is an EUV mask. The EUV mask, for example, may be provided by the same manufacturer that utilizes the EUV mask to fabricate integrated circuit devices. Alternatively, the EUV mask, for example, may be received from a vendor, which may be a third party. The provided/received EUV mask may include, among other things, a backside coating layer, a low thermal expansion material (LTEM), and a multilayer (ML) structure formed of, for example, silicon and molybdenum (Si/Mo). At block 104, a defect map is provided/received corresponding to the provided/received EUV mask. The defect map may be provided by the same manufacturer that provides the EUV mask and utilizes the final EUV mask to fabricate integrated circuit devices. Alternatively, for example, the defect map may be received from the same vendor from which the EUV mask was received. The provided/received defect map corresponds to the provided/received EUV mask such that it maps out locations of various defects such as, for example, phase defects resulting from embedded particle defects or multilayer defects. The defect locations may be mapped relative to alignment marks of the EUV mask. The defect map may include location/coordinates, size, shape, orientation, depth, and images of defects. At block 106, radiation beam writer data excluding defect regions identified in the provided/received defect map is prepared. At block 108, the EUV mask is processed according to the prepared radiation beam writer data thereby forming a pattern on the EUV mask. Forming the pattern on the EUV mask may include forming a buffer layer on the ML structure of the EUV mask, forming an absorber layer over the buffer layer, forming a resist layer over the absorber layer, using the beam writer data to pattern the resist layer with a radiation beam, and etching the absorber layer using the patterned resist layer. The method 100 continues with block 110 where a second mask is processed according to the prepared radiation beam writer data thereby forming a pattern on the second mask. The pattern of the second mask complements the pattern of the first mask such that excluded defect regions of the first mask are patterned on the second mask thereby making a complete pattern. The second mask, for example, may be another EUV mask or an optical mask. Additional steps can be provided before, during, and after the method 100, and some of the steps described can be replaced or eliminated for other embodiments of the method. The discussion that follows illustrates various embodiments of a plurality of masks that can be fabricated according to the method 100 of FIG. 1.

FIGS. 2A-6A illustrate top views of one embodiment of a mask (or reticle) at various stages of fabrication, according to the method of FIG. 1. FIGS. 2B-6B illustrate cross-sectional side views of one embodiment of a mask taken along line a-a of FIGS. 2A-6A. It is understood that the mask of FIGS. 2-6 have been simplified for the sake of clarity to better understand the inventive concepts of the present disclosure and that additional features can be added and some of the features described below can be replaced or eliminated in other embodiments of the mask.

Referring to FIGS. 2A and 2B, a top view and side view of a EUV mask 200 is illustrated. The EUV mask 200, for example, may be received from a third party vendor. Alternatively, the EUV mask 200 may be formed by a manufacturer that utilizes the EUV mask 200 to fabricate integrated circuit devices. Forming the EUV mask 200, for example, may include, among other things, a forming a backside coating layer 210 on a substrate 212. The backside coating may include a conductive material such as chrome nitride. The substrate 212 in the present embodiment may include a low thermal expansion material (LTEM) such as TiO2-SiO2 glass, an a ultra low expansion (ULE) material, or any appropriate material. A multilayer (ML) structure 214 is formed over the substrate 212 to provide a reflective mechanism. The ML structure 214, for example, includes numerous alternating layers of silicon and molybdenum (Si/Mo) deposited to act as a Bragg reflector that maximizes the reflection of EUV light. The alternating layers of ML 214, for example, may include about 40 to about 50 alternating pairs of Si/Mo. The alternating layers of ML 214 may be formed by any suitable process such as chemical vapor deposition (CVD), physical vapor deposition (PVD), atomic layer deposition (ALD), high density plasma CVD (HDPCVD), plating, other suitable methods, and/or combinations thereof. The CVD process, for example, may use chemicals including Hexachlorodisilane (HCD or $Si_2Cl_6$), Dichlorosilane (DCS or $SiH_2Cl_2$), Bis (TertiaryButylAmino) Silane (BTBAS or $C_8H_{22}N_2Si$) and Disilane (DS or $Si_2H_6$).

The EUV mask 200 may include defects 216 (e.g., embedded particles or multilayer defects) in various layers, such as the substrate 212 and/or the ML structure 214, across various areas. The defects 216 may vary in location, shape, size, depth, orientation, etc. The location, shape, size, depth, and orientation may take any random form. For example, a defect 216 may have a specific depth relative to the surface of the mask, an specific shape, and an orientation in the vertical direction or in the horizontal direction. These defect characteristics (e.g., depth, shape, size, etc. . . . ) ultimately affect the defect footprint illustrated on the top view of FIG. 2A.

The EUV mask 200 further includes alignment region 218, circumscribing a central portion of the mask where circuit features will be patterned. The alignment region 218 includes various alignment marks 220. The alignment marks 220 may have any appropriate shape, form, size, etc. The alignment marks 220 can be aligned to a coordinate system of a radiation beam writer, such as an electron beam writer, prior to pattern writing.

Still referring to FIGS. 2A and 2B, a defect map is provided/received corresponding to the EUV mask 200. The defect map may be provided by the manufacturer that forms the EUV mask 200 and utilizes the final EUV mask to fabricate integrated circuit devices. Alternatively, for example, the defect map may be received from the same vendor from which the EUV mask 200 was received. The defect map corresponds to the EUV mask 200 such that it maps out locations of the various defects 216 relative to the alignment marks 220 of the EUV mask 200. The defect map may include location/coordinates, size, shape, orientation, and images of defects. The defect map may be stored in a file in a database that is accessible by a computer operable to generate radiation beam writer data. The file, for example, may be a text file or a file specific to the apparatus utilizing such file.

Referring to FIGS. 3A and 3B, an absorber layer 222 is formed over the ML structure 214 for defining a pattern thereon. The absorber layer 222 may include any appropriate material. For example, in the present embodiment, the absorber layer 222 includes an anti-reflective layer, such as a tantalum boron nitride film (TaBN), tantalum nitride film (TaN), or any appropriate material, to define a layout pattern of an integrated circuit. The absorber layer 222 may be formed by any suitable process such as chemical vapor deposition (CVD), physical vapor deposition (PVD), atomic layer deposition (ALD), high density plasma CVD (HDPCVD), plating, other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

In one embodiment, the EUV mask 200 further includes a capping layer, such as ruthenium, to prevent oxidation and to act as an etch stop during other processing. The capping layer may be interposed between the ML structure 214 and the absorber layer 222. The capping layer may be formed by any suitable process such as chemical vapor deposition (CVD), physical vapor deposition (PVD), atomic layer deposition (ALD), high density plasma CVD (HDPCVD), plating, other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

In further embodiments, the EUV mask 200 further includes a buffer layer, such as silicon oxide ($SiO_2$), interposed between the capping layer and the absorber layer 222, for protection of the ML structure 214. The buffer layer may be formed by any suitable process such as chemical vapor deposition (CVD), physical vapor deposition (PVD), atomic layer deposition (ALD), high density plasma CVD (HDPCVD), plating, other suitable methods, and/or combinations thereof.

Still referring to FIGS. 3A and 3B, a resist layer 224 sensitive to a respective radiation source is formed over the absorber layer 222. In the present embodiment, the resist layer 224 includes a material such as Si3N4, or any appropriate material sensitive to an electron beam (e-beam). The resist layer 224 may be formed by a spin coating process or any suitable process.

Referring to FIGS. 4A and 4B, radiation beam writer data excluding defect regions 226 identified in the defect map is prepared for writing a pattern on the resist layer 224. The radiation beam writer data may utilize the location/coordinates, size, shape, depth, and orientation of the underlying defects relative to the alignment marks 220 to define excluded defect regions 226. In further embodiments, defining the excluded defect regions 226 may include utilizing defect image data. In addition to including data defining the excluded defect regions 226, the radiation beam writer data may further include data defining various patterns of features of integrated circuit devices to be formed with the EUV mask 200. The radiation beam writer data may be stored in a file (or in any other suitable structure) which is accessible by a computer operable to utilize the data to expose the EUV mask 200 to a radiation beam.

After the radiation beam writer data has been prepared, a radiation source (in the present embodiment an e-beam writer) is used to define a pattern including various features of the integrated circuit devices on the resist layer 224 of the EUV mask 200. The e-beam writing process may be implemented in a raster scan mode or a vector scan mode. The e-beam may be Gaussian beam or shaped beam. The e-beam patterning process may utilize single beam or multi-beam e-beam writing. The e-beam is applied to the resist layer 224 in a writing-mode according to the radiation beam writer data, such that an integrated circuit design layout excluding defect regions 226 is patterned on the resist layer 224. In another embodiment, the e-beam is applied to the resist layer in a projection-mode. The patterned regions of the resist layer 224 are denoted as 224a.

Referring to FIGS. 4A and 4B, after the resist layer 224 (of FIGS. 3A and 3B) is patterned in regions 224a, the resist layer 224 is used to etch the pattern in the absorber layer 222. The etching process may be a wet etching process, a dry etching process, or a combination thereof. Subsequent to the etching process additional processing such as chemical mechanical polishing (CMP) processes, cleaning processes, or other suitable process may be performed. The patterned regions of the absorber layer 222 are denoted as 222a. The resist layer 224 is subsequently removed by any suitable process. Notably, because the defect regions 226 are excluded from the patterning process, these defect regions 226 on the absorber layer 222 are not patterned with features of the integrated circuit devices.

Referring to FIGS. 5A and 5B, in one embodiment, where the excluded defect regions 226 of EUV mask 200 are in a critical area of the features of the integrated circuit devices, an additional EUV mask 300 is utilized to form the features of the integrated circuit devices excluded from the EUV mask 200. The EUV mask 300 may be used in critical areas because EUV mask 300 provides for greater resolution when compared to other masks, such as optical masks. Examples of critical areas may include excluded defect regions 226 of EUV mask 200 where there is a high density of circuit features, where there is a small pitch between circuit features, where a circuit feature performs a critical function, etc.

As illustrated in FIGS. 5A and 5B, in the present embodiment, EUV mask 300 includes a coating layer 210, a substrate 212 (which in the present embodiment is a low thermal expansion material (LTEM)), a multilayer (ML) structure 214 formed over the substrate 212, and an absorber layer 222 formed over the ML structure 214. The absorber layer 222 is patterned with circuit features in regions 222b that correspond to excluded defect regions 226 of the EUV mask 200. Although the EUV mask 300 may include various defects 216, the defects 216 do not affect the performance of the mask as they are not within the patterned regions 222b. The EUV mask 300 may include similar materials and may be formed according to similar processes used to form EUV mask 200. The difference being, however, that the EUV mask 300 is only patterned with circuit features in regions 222b which correspond to the excluded defect regions 226 of the EUV mask 200. Thus, the combination of the EUV mask 200 and the EUV mask 300 creates a complete pattern for features of integrated circuit devices.

Referring to FIGS. 6A and 6B, in an alternative embodiment, an optical mask 400 is utilized to form the features of the integrated circuit devices excluded from the EUV mask 200. The optical mask 400 may be utilized where the excluded defect regions 226 are not in critical areas of the features of the integrated circuit devices.

As illustrated in FIGS. 6A and 6B, in the present embodiment, the optical mask 400 includes a substrate 410. The substrate 410 may be formed of a transparent material such as fused silica quartz, or any appropriate material. Formed over the substrate 410 is an absorber layer 412. The absorber layer 412 may be formed using a plurality of processes and a plurality of materials, such as depositing a metal film made with chromium (Cr) and iron oxide, or an inorganic film made with MoSi, ZrSiO, SiN, and/or TiN. A light beam may be partially or completely blocked when directed on the absorption layer 412. The absorber layer 412 may be patterned to have one or more openings through which a light beam may travel without being absorbed by the absorber layer 412. In the present embodiment, the absorber layer 412 is patterned with circuit features only in regions 412*b* that correspond to excluded defect regions 226 of EUV mask 200. The optical mask 400 may incorporate other resolution enhancement techniques such as phase shift mask (PSM) and/or optical proximity correction (OPC). Thus, the combination of the EUV mask 200 and the optical mask 400 creates a complete pattern for features of integrated circuit devices.

It is understood that although FIGS. 1-6 illustrate embodiments where a first mask 200 and a second mask 300, 400 are used to form a complete pattern for features of integrated circuits, any appropriate number of masks may be used. In other embodiments, rather than using a second mask (e.g., EUV mask 300 or optical mask 400) a direct writing processes may be utilized to form the features of the integrated circuit device. For example, while manufacturing the integrated circuit device the patterns of circuit features excluded from the EUV mask 200 (in defect regions 226) are written by an e-beam process on an underlying substrate. This embodiment may be utilized where there is a need for high accuracy and/or where there are relatively few patterns to be formed using the direct writing process. Accordingly, during manufacturing, various embodiments of methods may be utilized to fabricate integrated circuit devices with EUV mask 200 in combination with EUV mask 300, optical mask 400, and/or a direct writing process.

Figure 7:
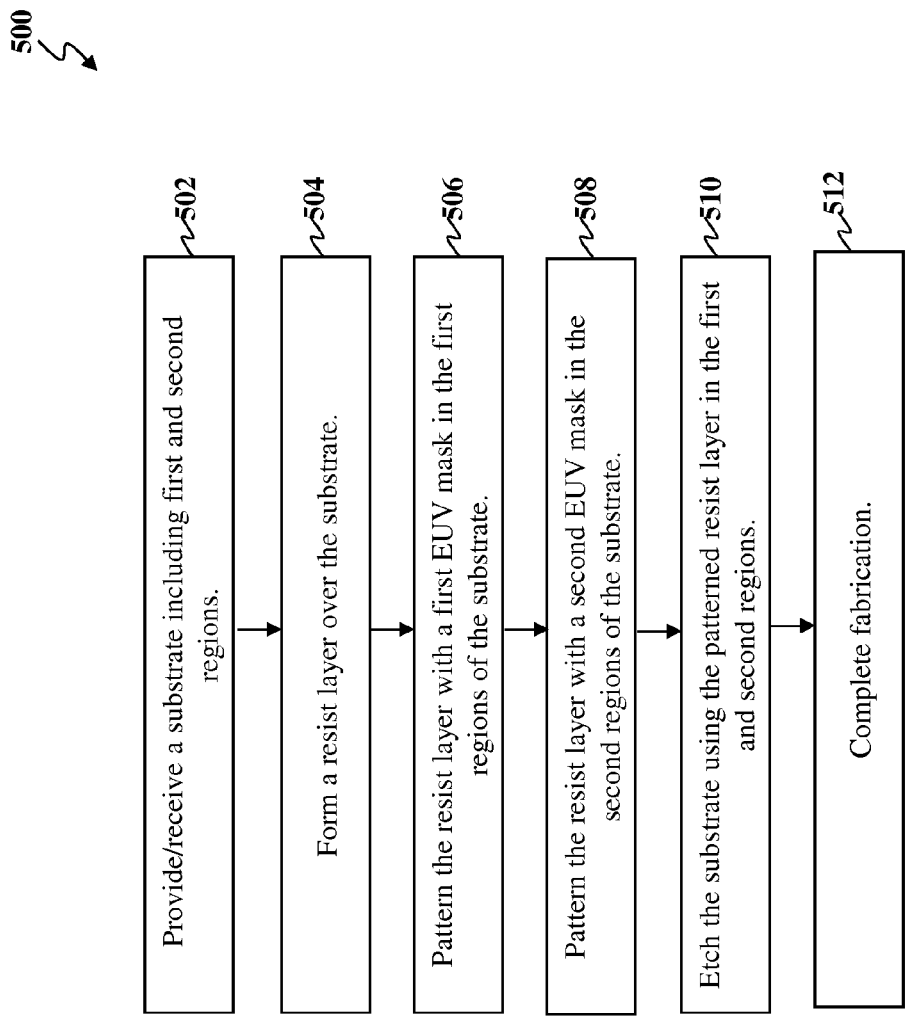
FIG. 7 is a flowchart illustrating a method of fabricating an integrated circuit device according to various aspects of the present disclosure.

Referring to FIGS. 7-11, a method 500 and an integrated circuit device 600 are collectively described below. In the present embodiment, FIG. 7 is a flow chart of a method 500 for fabricating an integrated circuit device 600 according to various aspects of the present disclosure. The method 500 begins at block 502 where a substrate including first and second regions is provided/received. At block 504 a resist layer is formed over the substrate. At block 506, the resist layer is patterned with a first EUV mask in the first region. At block 508, the resist layer is patterned with a second EUV mask in the second region. At block 510, the substrate is etched using the patterned resist layer in the first and second regions. The etching process may be a wet etching process, a dry etching process, or a combination thereof. The method 500 continues with block 512, where fabrication is completed. Additional steps can be provided before, during, and after the method 500, and some of the steps described can be replaced or eliminated for other embodiments of the method. The discussion that follows illustrates various embodiments of forming an integrated circuit device according to the method 500 of FIG. 7.

Figure 8:
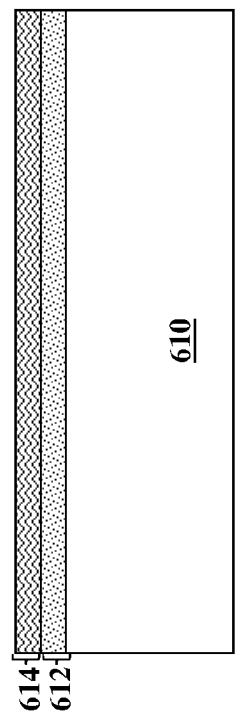
FIGS. 8-11, illustrate cross-sectional side views of an integrated circuit device formed according to the method of FIG. 7.

Referring to FIG. 8, a diagrammatic cross-sectional side view of an integrated circuit device 600 (e.g., a semiconductor device) is illustrated. It is understood that the semiconductor device 600 has been simplified for the sake of clarity to better understand the inventive concepts of the present disclosure. Additional features can be added in the semiconductor device 600, and some of the features described below can be replaced or eliminated in other embodiments of the semiconductor device 600.

Still referring to FIG. 8, the semiconductor device 600 includes a substrate 610. The substrate 610, for example, can be a bulk substrate or a silicon-on-insulator (SOI) substrate. The substrate may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. The SOI substrate can be fabricated using separation by implantation of oxygen (SIMOX), wafer bonding, and/or other suitable methods. The substrate 610 may be a p-type substrate, an n-type substrate, or a combination thereof. It is understood, that although the present disclosure provides various examples of a substrate, the scope of the disclosure and claims should not be limited to the specific examples unless expressly claimed.

Still referring to FIG. 8, the substrate 610 includes one or more layers 612 to be patterned. The layers may be, for example, dielectric layers, non-dielectric layers, metal layers, etc. The one or more layers 612 may formed by be chemical vapor deposition (CVD), physical vapor deposition (PVD), atomic layer deposition (ALD), high density plasma CVD (HDPCVD), plating, other suitable methods, and/or combinations thereof. Formed over the layers 612 is a resist layer 614. The resist layer 614 includes a material sensitive to EUV processing. The resist layer 614 may be formed by a spin coating process or any suitable process. Other steps may be further implemented after the coating of the resist layer 614. For example, a baking process may be applied to the resist layer 614 to partially drive out solvents (used in the spin coating process) from the resist layer 614.

Figure 9:
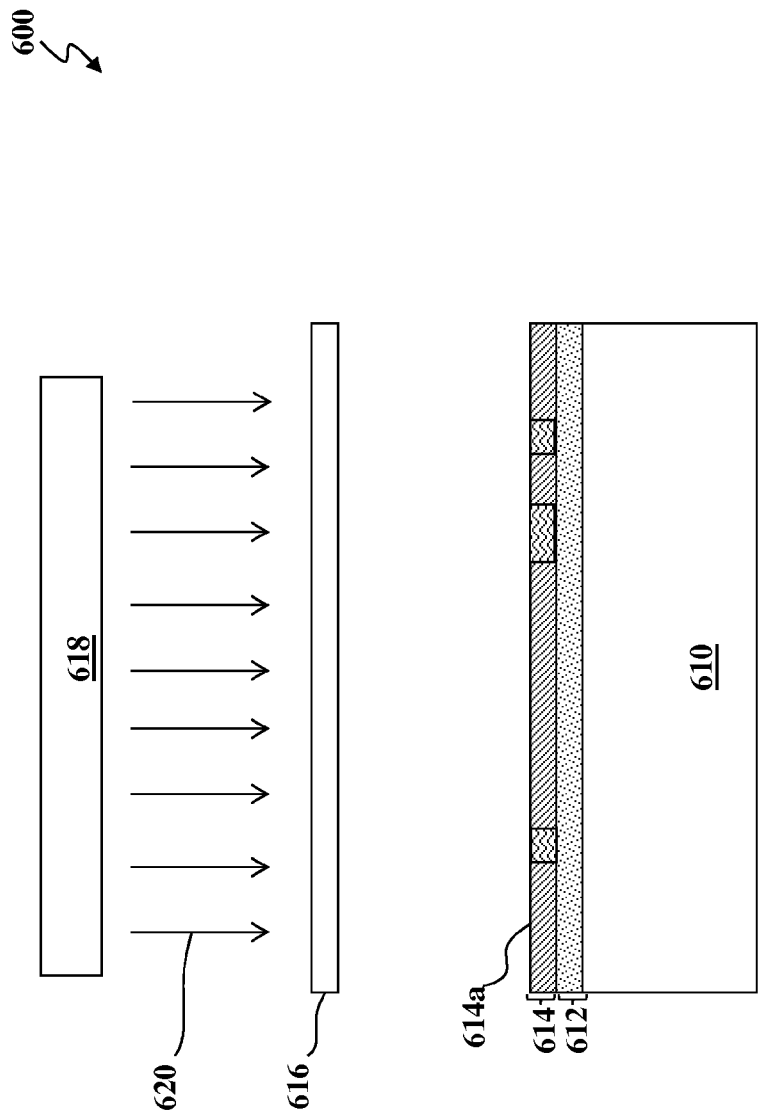

Referring to FIG. 9, a first exposure process is performed to pattern the resist layer 614. The first exposure process, for example, uses a first EUV mask 616 (such as EUV mask 200 or EUV mask 300), to define a first pattern on the resist layer 614 in first regions of the substrate 610. In the present embodiment, the first EUV mask 616 is EUV mask 200 and the first regions of the substrate 610 correspond to regions of EUV mask 200 free of significant defects which adversely affect the exposure and patterning process. In other words, in the present embodiment, the first EUV mask 616 does not pattern the resist layer 614 underlying defect regions 226 of EUV mask 200.

During the exposure process, the first EUV mask 616 may be secured on a reticle stage of the exposure system by clamping mechanisms, such as a vacuum clamping or e-chuck clamping. After the first EUV mask 616 is secured, a radiation source 618 is used to expose the resist layer 614 to radiation 620 to thereby form a pattern on the resist layer 614. The portions of the resist layer 614 exposed during the first exposure process are denoted as 614*a*. In one example, the radiation source 618 is a EUV source having a wavelength around 13.5 nm.

Figure 10:
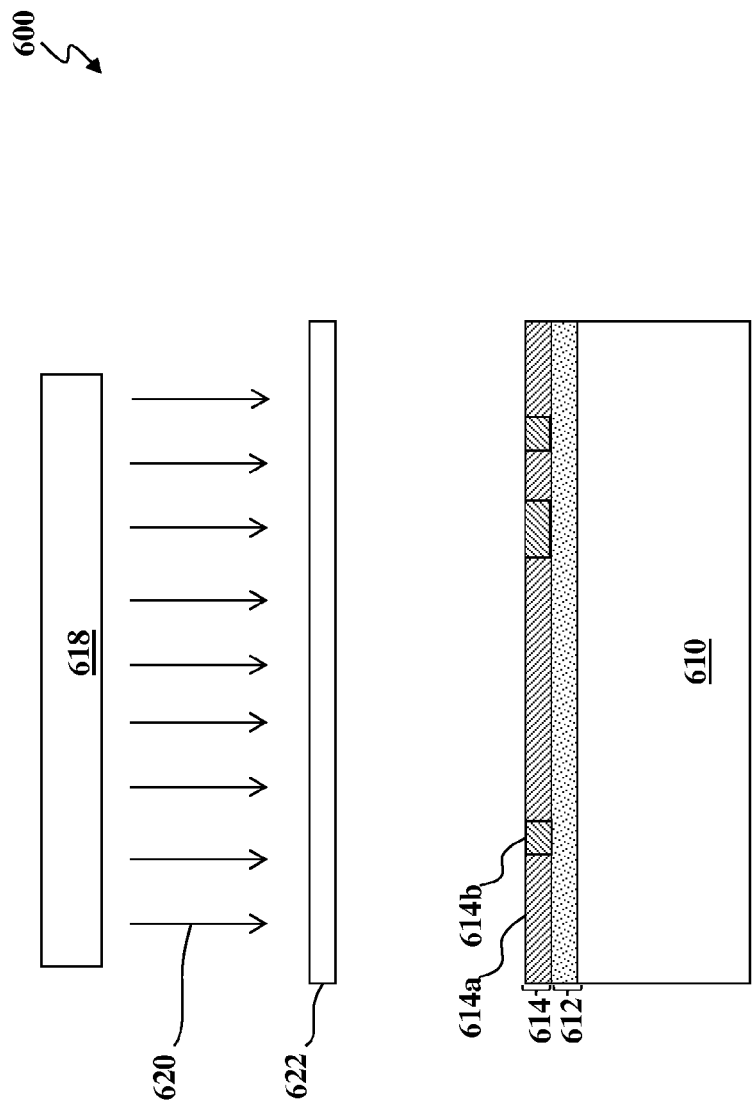

Referring to FIG. 10, a second exposure process is performed to pattern the resist layer 614. The second exposure process, for example, uses a second EUV mask 622 (such as EUV mask 200 or EUV mask 300), to define a second pattern on the resist layer 614 in second regions 614*b*. In the present embodiment, because the first EUV mask 616 was the EUV mask 200 the second EUV mask 622 is EUV mask 300. In alternative embodiments, the first EUV mask 616 is EUV mask 300 and the second EUV mask 622 is EUV mask 200. The second regions 614*b* correspond to regions that were not patterned during the first exposure process.

During the second exposure process, the second EUV mask 622 may be secured on a reticle stage of the exposure system by clamping mechanisms, such as a vacuum clamping or e-chuck clamping. After the second EUV mask 622 is secured, the radiation source 618 is used to expose the resist layer 614 to radiation 620 to thereby form a pattern on the resist layer 614. The portions of the resist layer 614 exposed during the second exposure process are denoted as 614*b*. In one example, the radiation source 618 is a EUV source having a wavelength around 13.5 nm.

Figure 11:
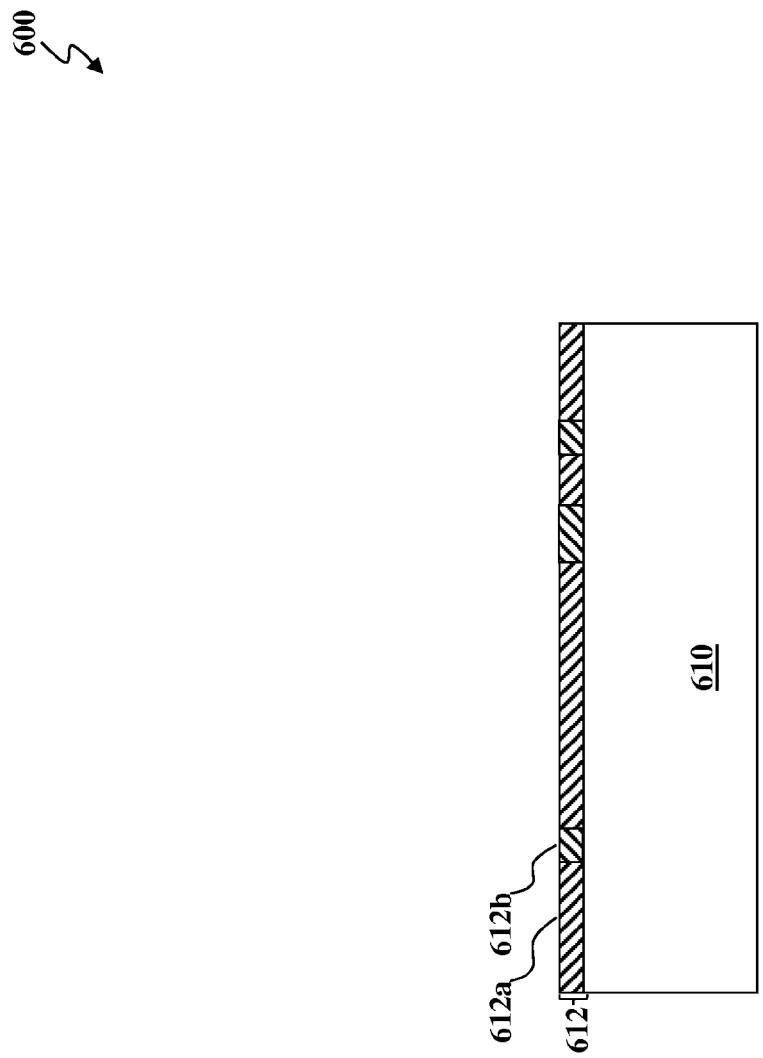

Referring to FIG. 11, after performing the first and second exposure processes, the patterned resist layer 614 may be developed and used to etch layers 612 of the substrate 610 to thereby form patterns of circuit features thereon. The etching process may be a wet etching process, a dry etching process, or a combination thereof. The portions of layers 612 etched with patterns corresponding to the first EUV mask 616 (in the present example EUV mask 200) are denoted as 612a and portions of layers 612 etched with patterns corresponding to the second EUV mask 622 (in the present example EUV mask 300) are denoted as 612b. Thus, layers 612 include a complete pattern of circuit features formed using both the first EUV mask 616 and the second EUV mask 622.

Referring to FIGS. 12-20, a method 700 and an integrated circuit device 800 are collectively described below. The embodiment of method 700 may include similar process steps as an embodiment of the method 500 which is disclosed above. In disclosing the embodiment of method 700, some details regarding processing and/or structure may be skipped for simplicity if they are similar to those described in the embodiment of method 500.

Figure 12:
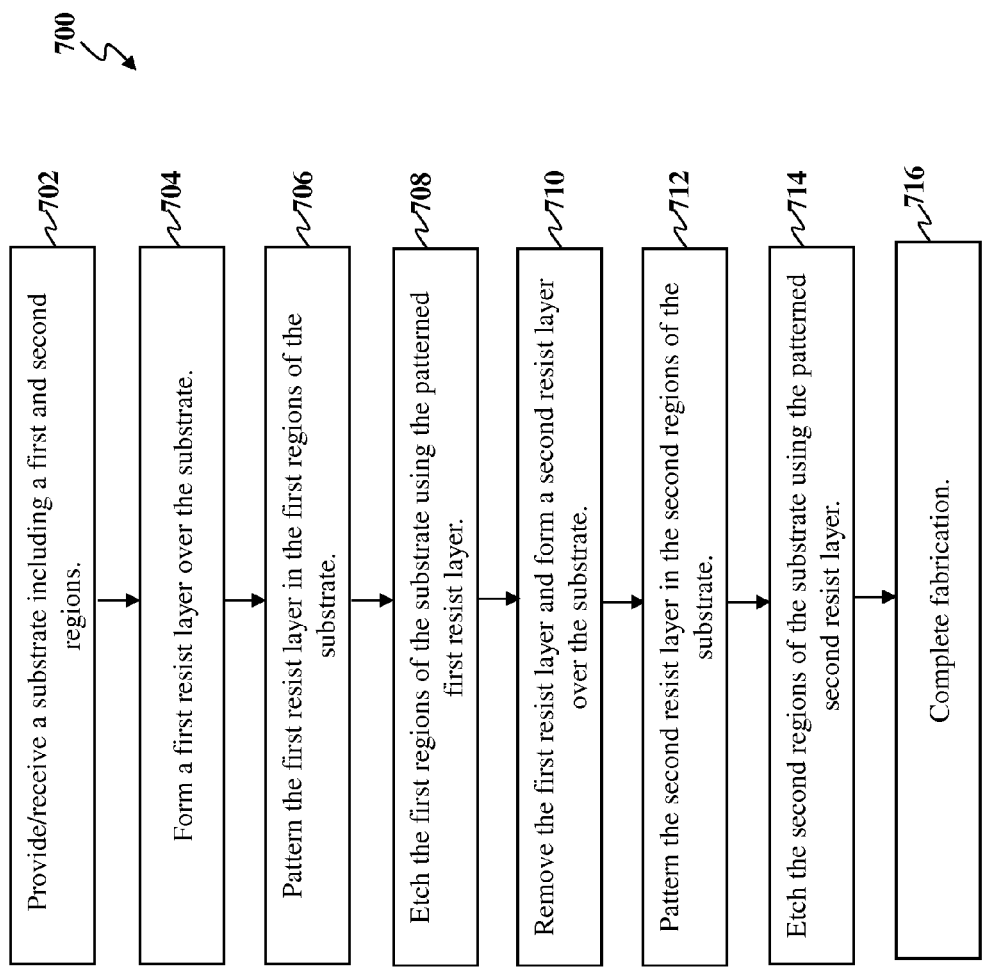
FIG. 12 is a flowchart illustrating a method of fabricating an integrated circuit device according to various aspects of the present disclosure.

Still referring to FIG. 12, in the present embodiment, the method 700 is for fabricating an integrated circuit device 800 according to various aspects of the present disclosure. The method 700 begins at block 702 where a substrate including first and second regions is provided/received. At block 704 a first resist layer is formed over the substrate. At block 706, the first resist layer is patterned in the first regions of the substrate. At block 708, the first regions of the substrate are etched using the patterned first resist layer. At block 710, the first resist layer is removed and a second resist layer is formed over the substrate. At block 712, the second resist layer is patterned in the second regions of the substrate. At block 714, the second regions of the substrate are etched using the patterned second resist layer. The method 700 continues with block 716, where fabrication is completed. Additional steps can be provided before, during, and after the method 700, and some of the steps described can be replaced or eliminated for other embodiments of the method. The discussion that follows illustrates various embodiments of forming an integrated circuit device 800 according to the method 700 of FIG. 12.

FIGS. 13-20 illustrate diagrammatic cross-sectional side views of one embodiment of a semiconductor device 800 at various stages of fabrication. The semiconductor device 800 of FIGS. 13-20 is similar in certain respects to the semiconductor device 600 of FIGS. 8-11. Accordingly, similar features in FIGS. 8-11 and FIGS. 13-20 are identified by the same reference numerals for clarity and simplicity. It is understood that the semiconductor device 800 of FIGS. 13-20 has been simplified for the sake of clarity to better understand the inventive concepts of the present disclosure. Additional features can be added in the semiconductor device 800, and some of the features described below can be replaced or eliminated in other embodiments of the semiconductor device 800.

Figure 13:
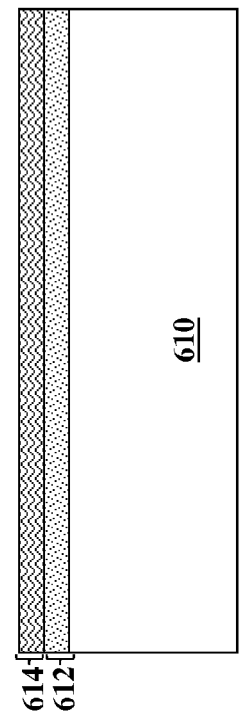
FIGS. 13-20, illustrate cross-sectional side views of an integrated circuit device formed according to the method of FIG. 12.

Referring to FIG. 13, the semiconductor device 800 includes a substrate 610. The substrate 610, for example, can be a bulk substrate or a silicon-on-insulator (SOI) substrate. In the present embodiment, the substrate 610 defined in the semiconductor device 800 is substantially similar to the substrate 610 of the semiconductor device 600 in terms of material composition and formation. In an alternative embodiment, they are different.

Still referring to FIG. 13, the substrate 610 includes one or more layers 612 to be patterned. In the present embodiment, the layers 612 defined in the semiconductor device 800 are substantially similar to the layers 612 of the semiconductor device 600 in terms of material composition and formation. In an alternative embodiment, they are different.

Formed over the layers 612 is a resist layer 614. The resist layer 614 includes a material sensitive to EUV processing. In the present embodiment, the resist layer 614 defined in the semiconductor device 800 is substantially similar to the resist layer 614 of the semiconductor device 600 in terms of material composition and formation. In an alternative embodiment, they are different.

Figure 14:
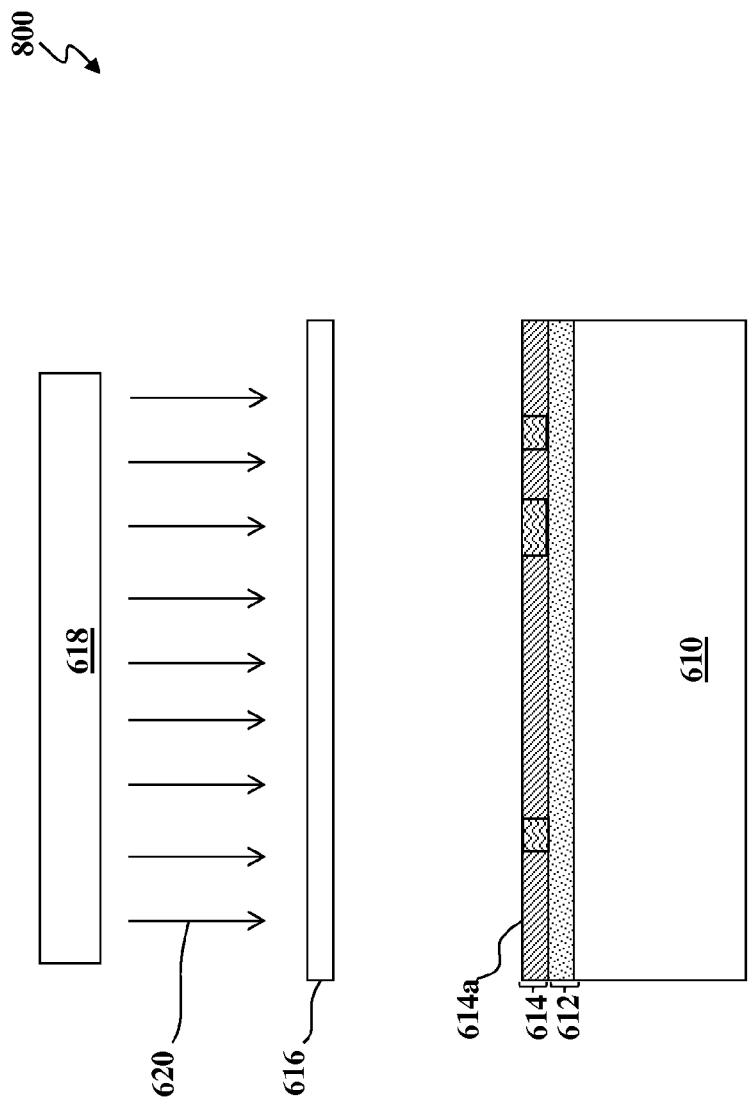

Referring to FIG. 14, a first exposure process is performed to pattern the resist layer 614. The first exposure process, for example, uses a first EUV mask 616 (such as EUV mask 200), to define a first pattern on the resist layer 614 in first regions of the substrate 610. In the present embodiment, the first EUV mask 616 is EUV mask 200 and the first regions of the substrate 610 correspond to regions of EUV mask 200 free of significant defects which adversely affect the exposure and patterning process. In other words, in the present embodiment, the first EUV mask 616 does not pattern the resist layer 614 underlying defect regions 226 of EUV mask 200.

During the exposure process, the first EUV mask 616 may be secured on a reticle stage of the exposure system by clamping mechanisms, such as a vacuum clamping or e-chuck clamping. After the first EUV mask 616 is secured, a radiation source 618 is used to expose the resist layer 614 to radiation 620 to thereby form a pattern on the resist layer 614. The portions of the resist layer 614 exposed during the first exposure process are denoted as 614a. In one example, the radiation source 618 is a EUV source having a wavelength around 13.5 nm.

Figure 15:
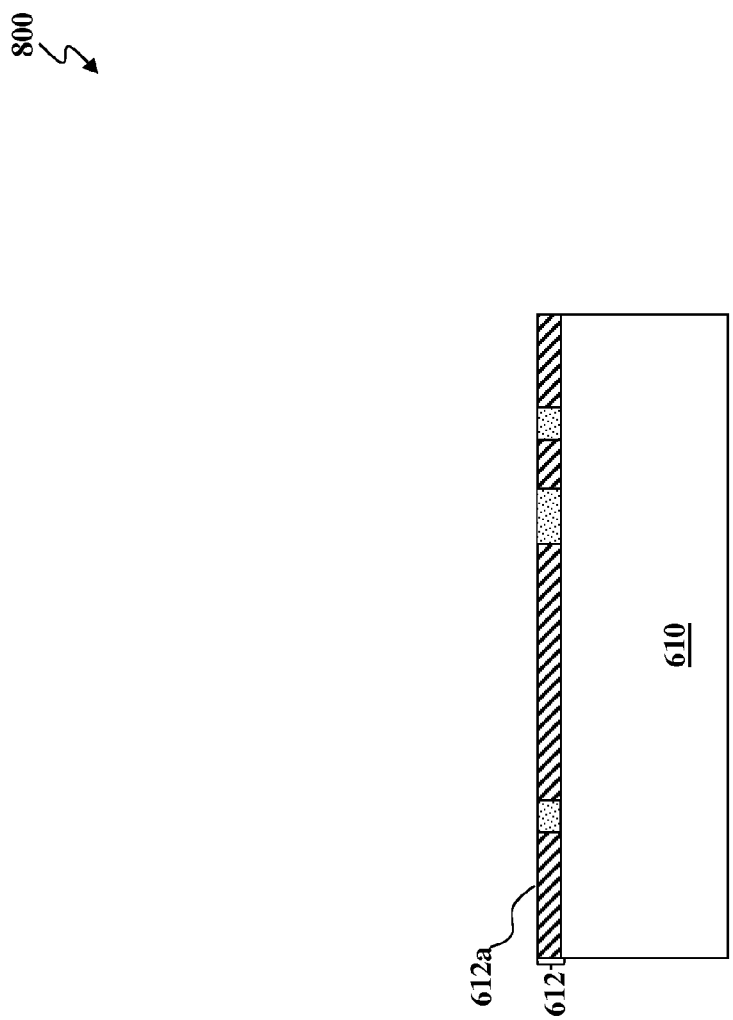

Referring to FIG. 15, after performing the first exposure process, the patterned resist layer 614 may be developed and used to etch first regions 612a of the layers 612 of the substrate 610 to thereby form patterns of circuit features thereon. The etching process may be a wet etching process, a dry etching process, or a combination thereof.

Still referring to FIG. 15, after patterning first regions 612a of the layers 612 of the substrate 610, the resist layer 614 is removed by any suitable process. For example, the resist layer 614 may be removed by a liquid "stripper", which chemically alters the resist layer 614 so that it no longer adheres to the underlying layers 612. Alternatively, resist layer 614 may be removed by a plasma containing oxygen, which oxidizes it, or any suitable process.

Figure 16:
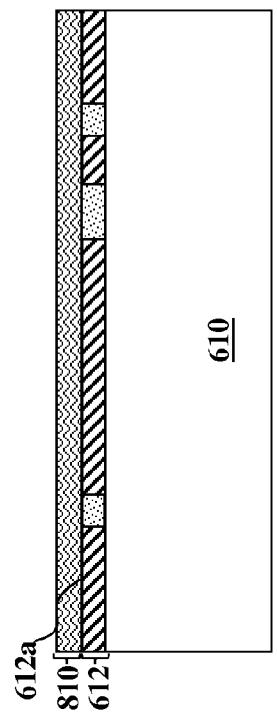

Referring to FIG. 16, a second resist layer 810 is formed over the layers 612. In the present embodiment, the resist layer 810 is used in subsequent EUV processing that uses a second EUV mask (such as EUV mask 300). Accordingly, in the present embodiment, the resist layer 810 includes a material sensitive to EUV processing similar to the resist layer 614 in terms of material composition and formation.

Still referring to FIG. 16, in an alternative embodiment, the second resist layer 810 is used in subsequent standard lithography processing that uses an optical mask (such as optical mask 400). Accordingly, in alternative embodiment, the resist layer 810 includes a material sensitive to standard photolithography processing. Thus, in such alternative embodiments, the resist layer 810 material may include a photoresist material. The material of the resist layer 810 may be applied to the substrate 610 via any appropriate processing such as spin coating, or any other suitable processing.

Figure 17:
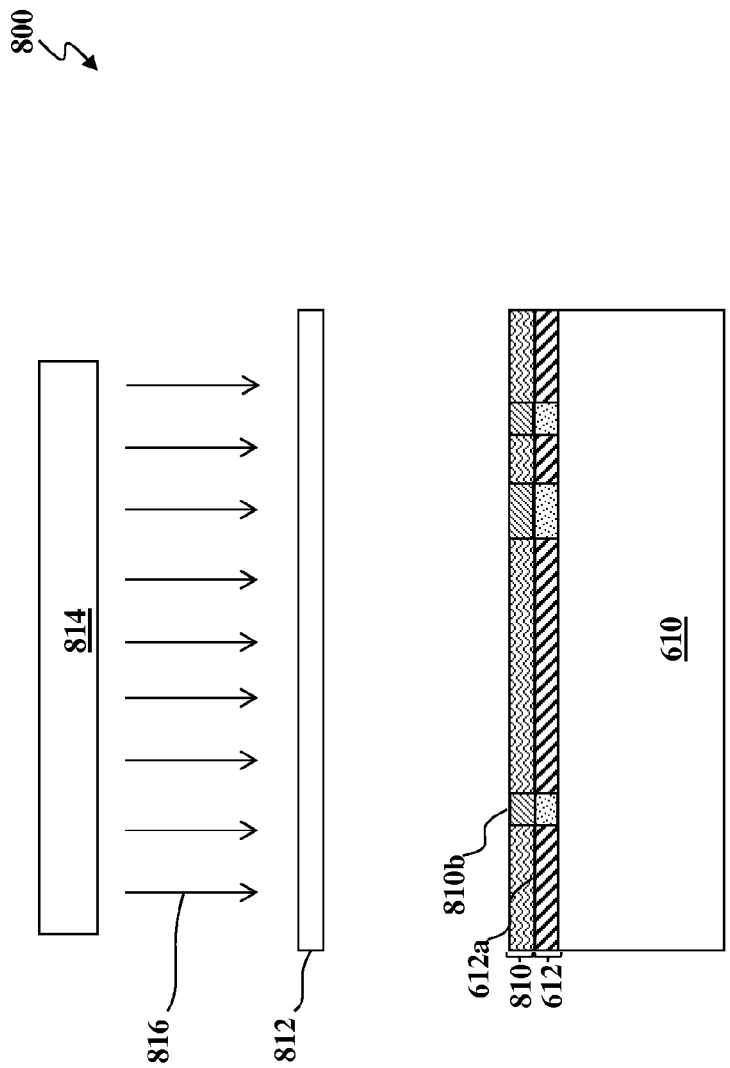

Referring to FIG. 17, a second exposure process is performed to pattern the resist layer 810. In the present embodiment, the second exposure process uses a second mask 812, to define a second pattern on the resist layer 810 in second regions 810b. In the present embodiment, the second mask 812 is a EUV mask (such as EUV mask 300). The second regions 810b correspond to regions that were not patterned during the first exposure process (of FIG. 14).

During the second exposure process, the second mask 812 may be secured on a reticle stage of the exposure system by clamping mechanisms, such as a vacuum clamping or e-chuck clamping. After the second mask 812 is secured, the radiation source 814 is used to expose the resist layer 810 to radiation 816 to thereby form a pattern on the resist layer 810. The portions of the resist layer 810 exposed during the second exposure process are denoted as 810b. In one example, the radiation source 814 is a EUV source having a wavelength less than or around 13.5 nm.

Still referring to FIG. 17, in an alternative embodiment, the second mask 812 is an optical mask (such as optical mask 400), used to define a second pattern on the resist layer 810 in second regions 810b. The second regions 810b correspond to regions that were not patterned during the first exposure process (of FIG. 14).

During the second exposure process, the second mask 812 may be secured on a reticle stage of the exposure system by clamping mechanisms, such as a vacuum clamping or e-chuck clamping. After the second mask 812 is secured, the radiation source 814 is used to expose the resist layer 810 to radiation 816 to thereby form a pattern on the resist layer 810. The portions of the resist layer 810 exposed during the second exposure process are denoted as 810b. In one example, the radiation source 814 is a ultraviolet (UV) source having a wavelength less than or around 400 nm.

Figure 18:
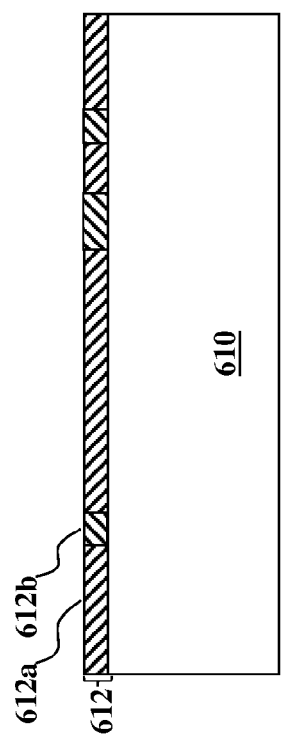

Referring to FIG. 18, after performing the second exposure process, the patterned resist layer 810 may be developed and used to etch second regions 612b of the layers 612 of the substrate 610 to thereby form patterns of circuit features thereon. The etching process may be a wet etching process, a dry etching process, or a combination thereof. The portions of layers 612 etched with patterns corresponding to the first mask 616 (in the present example EUV mask 200) are denoted as 612a and portions of layers 612 etched with patterns corresponding to the second mask 810 (in the present example EUV mask 300 and in the alternative example optical mask 400) are denoted as 612b. Thus, layers 612 include a complete pattern of circuit features formed using both the first mask 616 and the second mask 810.

Figure 19:
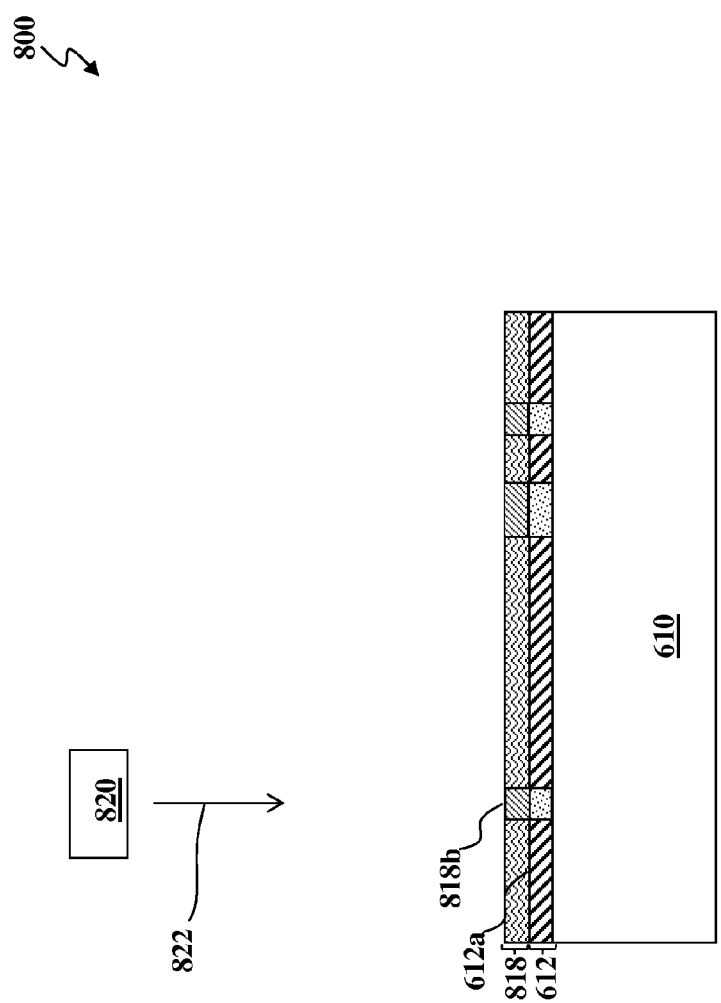

Referring to FIG. 19, in other embodiments, rather than using the second mask 812 and radiation source 814 of FIG. 17 for performing the second exposure process, a mask free direct writing process is used. In such embodiments, a resist layer 818 is used that includes a material sensitive to a beam emitted from the direct writing source 820. In such embodiments, for example, the direct writing source 820 may be a device that emits an electron beam (e-beam) 822 used in an e-beam writing process. The e-beam writing process may be implemented in a raster scan mode or a vector scan mode. The e-beam 822 may be Gaussian beam or shaped beam. The e-beam patterning process may utilize single or multiple e-beams 822. The e-beam 822 is applied to the resist layer 818 in a writing-mode such that an integrated circuit design layout is patterned on the resist layer 818 in second regions 818b. In further embodiments, the e-beam 822 is applied to the resist layer 818 in a projection-mode such that an integrated circuit design layout is patterned on the resist layer 810 in second regions 818b. The second regions 818b of the resist layer 818 correspond to regions that were not patterned during the first exposure process (of FIG. 14).

Figure 20:
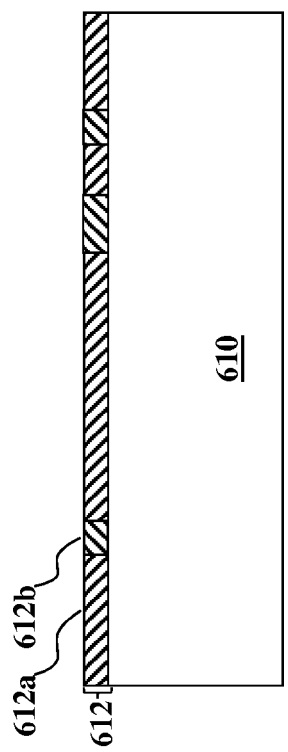

Referring to FIG. 20, after performing the second exposure process, the patterned resist layer 818 may be developed and used to etch second regions 612b of the layers 612 of the substrate 610 to thereby form patterns of circuit features thereon. The etching process may be a wet etching process, a dry etching process, or a combination thereof. The portions of layers 612 etched with patterns corresponding to the first mask 616 (in the present example EUV mask 200) are denoted as 612a and portions of layers 612 etched with a direct writing device (in the present example direct writing source 820 that emits e-beam 822) are denoted as 612b. Thus, layers 612 include a complete pattern of circuit features formed using both the first mask 616 and the direct writing source 820.

It is understood that in alternative embodiments, patterning with the second mask 812 and/or direct writing source 820 may be performed first followed by patterning with the first mask 616. In other words, patterning the second regions 612b of the layers 612 of the substrate 610 may be patterned first and the first regions 612a of the layer 612 of the substrate may be patterned second.

The above method 100 provides for an improved process to form a plurality of masks. For example, a first mask (EUV mask) that has defects is patterned with circuit features in regions where no or minimal defects are present and a second mask (EUV mask or optical mask) is patterned with circuit features in regions where the defects were present in the first mask. Thus, the second mask complements the first mask and the two masks include patterns of complete circuit features. Because the first mask is patterned, regardless of the fact that is has defects in various regions, mask cost is minimized as no or minimal defect repairs are necessary. Further, the cost is minimized as mask defect tolerances are not overly stringent. Different embodiments may have different advantages, and no particular advantage is necessarily required of any embodiment.

Further, the above method 500 and 700 for manufacturing a semiconductor device allows for improving overall device performance and reducing manufacturing cost when compared with traditional manufacturing processes. For example, because the semiconductor device is formed in a two-step exposure processes which use the first mask and either the second mask or a direct writing process, manufacturing defects which would have resulted from otherwise present mask defects is avoided. Furthermore, the methods described herein can be easily implemented into current manufacturing process and technology, thereby lowering cost and minimizing complexity. Different embodiments may have different advantages, and no particular advantage is necessarily required of any embodiment.

Thus, provided is a method. The exemplary method includes receiving a first mask. The method further includes receiving a defect map, the defect map identifying a defect region of a defect of the first mask. The method further includes preparing processing data, the processing data including pattern data of a semiconductor device and data associated with the defect region. The method further includes processing the first mask according to the processing data thereby forming a first portion of a pattern of the semiconductor device on the first mask, the first portion of the pattern excluding the defect region.

In some embodiments, the method further includes receiving a second mask and processing the second mask according to the processing data thereby forming a second portion of the pattern of the semiconductor device on the second mask, the second portion of the pattern including the defect region.

In some embodiments, the first mask is an extreme ultraviolet (EUV) mask, and processing the first mask includes: forming a resist layer over an absorber layer of the first mask;

patterning the resist layer; and etching the absorber layer through openings of the patterned resist layer thereby forming the first portion of the pattern of the semiconductor device on the first mask. In further embodiments, the second mask is one of an EUV mask and an optical mask, and processing the second mask includes: forming a resist layer over an absorber layer of the second mask; patterning the resist layer with a direct writing device; and etching the absorber layer through openings of the patterned resist layer thereby forming the second portion of the pattern of the semiconductor device on the second mask. In various embodiments, a location of the defect region is represented by coordinates relative to alignment marks of the first mask. In certain embodiments, the defect map includes defect image data of the defect region, and processing the first mask includes using the defect image data to determine a size of the defect region. In some embodiments, processing the first mask includes using the defect image data to determine an orientation of the defect region. In further embodiments, processing the first mask includes using the defect image data to determine a shape of the defect region. In various embodiments, the defect is a phase defect.

Also provided is an embodiment of an apparatus. The apparatus includes a first mask including first and second regions, wherein the first region is substantially phase defect free, the first mask comprising: a substrate; and a patterned layer formed over the substrate, the patterned layer including a first portion of a pattern of an integrated circuit formed in the first region of the first mask. The apparatus further includes a second mask including first and second regions, wherein the first and second regions of the second mask correspond to the first and second regions of the first mask, the second mask comprising: a substrate; and a patterned layer formed over the substrate, the patterned layer including a second portion of the pattern of the integrated circuit formed in the second region of the second mask.

In some embodiments, the first mask is an extreme ultraviolet (EUV) mask, the substrate of the first mask includes a low thermal expansion material (LTEM) and a multilayer (ML) structure formed over the LTEM material, and the patterned layer of the first mask is an absorber layer formed over the ML structure. In various embodiments, the second mask is an EUV mask, and the substrate of the first mask includes a low thermal expansion material (LTEM) and a multilayer (ML) structure formed over the LTEM material, and the patterned layer of the second mask is an absorber layer formed over the ML structure. In certain embodiments, the second mask is an optical mask, the substrate of the second mask includes fused silica quartz, and the patterned layer of the second mask is an absorber layer formed over the substrate. In further embodiments, the ML structure includes alternating layers of silicon (Si) and molybdenum (Mo), and the absorber layer of the first mask includes tantalum boron nitride (TaBN).

Also provided is a method of forming a semiconductor device. The exemplary method includes providing a first mask including first and second regions, wherein the first region of the first mask is substantially phase defect free and includes a first portion of a pattern of a semiconductor device. The method further includes, providing a second mask including first and second regions, wherein the first and second regions of the second mask correspond to the first and second regions of the first mask, and wherein the second region of the second mask includes a second portion of the pattern of the semiconductor device. The method further includes providing a substrate including first and second regions. The method further includes forming a first pattern, in the first region of the substrate, of the first portion of the pattern of the semiconductor device using first mask and forming a second pattern, in the second region of the substrate, of the second portion of the pattern of the semiconductor device using second mask.

In some embodiments, providing the first mask includes providing an extreme ultraviolet (EUV) mask including: a low thermal expansion material (LTEM); a multilayer (ML) structure formed over the LTEM material, and a pattern layer formed over the ML structure. In various embodiments, providing the second mask includes providing an extreme ultraviolet (EUV) mask including: a low thermal expansion material (LTEM); a multilayer (ML) structure formed over the LTEM material, and a pattern layer formed over the ML structure. In certain embodiments, providing the second mask includes providing an optical mask including: fused silica quartz, and a pattern layer formed over the fused silica quartz. In further embodiments, forming the pattern, in the first region of the substrate, includes an extreme ultraviolet (EUV) process. In various embodiments, forming the patter, in the second region of the substrate, includes one of an EUV process and an optical process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving a first mask including a first portion that is pattern free;
receiving a defect map, the defect map identifying a defect region of a defect of the first portion of the first mask;
preparing processing data, the processing data including pattern data of a semiconductor device and data associated with the defect region; and
processing the first portion of the first mask according to the processing data thereby forming a first portion of a pattern of the semiconductor device on the first portion of the first mask, the first portion of the pattern excluding the defect region.

2. The method of claim 1 further comprising:
receiving a second mask including a second portion that is pattern free; and
processing the second mask according to the processing data thereby forming a second portion of the pattern of the semiconductor device on the second portion of the second mask, the second portion of the pattern including the defect region.

3. The method of claim 1 wherein the first mask is an extreme ultraviolet (EUV) mask, and
wherein processing the first portion of the first mask includes:
forming a resist layer over an absorber layer of the first portion of the first mask;
patterning the resist layer; and
etching the absorber layer through openings of the patterned resist layer thereby forming the first portion of the pattern of the semiconductor device on the first portion of the first mask.

4. The method of claim 2 wherein the second mask is one of an EUV mask and an optical mask, and
wherein processing the second portion of the second mask includes:
forming a resist layer over an absorber layer of the second portion of the second mask;
patterning the resist layer; and
etching the absorber layer through openings of the patterned resist layer thereby forming the second portion of the pattern of the semiconductor device on the second portion of the second mask.

5. The method of claim 1 wherein a location of the defect region is represented by coordinates relative to alignment marks of the first mask.

6. The method of claim 1 wherein the defect map includes defect image data of the defect region, and
wherein processing the first mask includes using the defect image data to determine a size of the defect region.

7. The method of claim 6 wherein processing the first portion of the first mask includes using the defect image data to determine an orientation of the defect region.

8. The method of claim 6 wherein processing the first portion of the first mask includes using the defect image data to determine a shape of the defect region.

9. The method of claim 1 wherein the defect is a phase defect.

10. An apparatus comprising:
a first mask including first and second regions, wherein the first region is substantially phase defect free, the first mask comprising:
a first substrate; and
a first patterned layer formed over the first substrate, the first patterned layer including a first portion of a pattern of an integrated circuit formed in the first region of the first mask; and
a second mask including first and second regions, wherein the first and second regions of the second mask correspond to the first and second regions of the first mask, the second mask comprising:
a second substrate; and
a second patterned layer formed over the second substrate, the second patterned layer including a second portion of the pattern of the integrated circuit formed in the second region of the second mask.

11. The apparatus of claim 10 wherein the first mask is an extreme ultraviolet (EUV) mask,
wherein the first substrate of the first mask includes a low thermal expansion material (LTEM) and a multilayer (ML) structure formed over the LTEM material, and
wherein the first patterned layer of the first mask is an absorber layer formed over the ML structure.

12. The apparatus of claim 10 wherein the second mask is an EUV mask, and
wherein the second substrate of the second mask includes a low thermal expansion material (LTEM) and a multilayer (ML) structure formed over the LTEM material, and
wherein the second patterned layer of the second mask is an absorber layer formed over the ML structure.

13. The apparatus of claim 10 wherein the second mask is an optical mask,
wherein the second substrate of the second mask includes fused silica quartz, and
wherein the second patterned layer of the second mask is an absorber layer formed over the second substrate.

14. The apparatus of claim 11 wherein the ML structure includes alternating layers of silicon (Si) and molybdenum (Mo), and
wherein the absorber layer of the first mask includes tantalum boron nitride (TaBN).

15. An apparatus comprising:
a first extreme ultraviolet (EUV) mask including first and second regions, wherein the first region of the first mask is substantially phase defect free and includes a first portion of a pattern of a semiconductor device;
a second mask including first and second regions, wherein the first and second regions of the second mask correspond to the first and second regions of the first mask, and wherein the second region of the second mask includes a second portion of the pattern of the semiconductor device.

16. The apparatus of claim 15 wherein the first mask includes:
a low thermal expansion material (LTEM);
a multilayer (ML) structure formed over the LTEM material, and
a pattern layer formed over the ML structure, the pattern layer including the first portion of the pattern of the semiconductor device.

17. The apparatus of claim 15 wherein the second mask is an EUV mask and includes:
a low thermal expansion material (LTEM);
a multilayer (ML) structure formed over the LTEM material, and
a pattern layer formed over the ML structure, the pattern layer including the second portion of the pattern of the semiconductor device.

18. The apparatus of claim 15 wherein the second mask is an optical mask and includes:
fused silica quartz, and
a pattern layer formed over the fused silica quartz, the pattern layer including the second portion of the pattern of the semiconductor device.

19. The apparatus of claim 15 wherein the first mask includes:
a first substrate; and
a first patterned layer formed over the first substrate, the first patterned layer including a first portion of a pattern of an integrated circuit formed in the first region of the first mask.

20. The apparatus of claim 19 wherein the second mask includes:
a second substrate; and
a second patterned layer formed over the second substrate, the second patterned layer including a second portion of the pattern of the integrated circuit formed in the second region of the second mask.

* * * * *